(12) United States Patent
Garcia-Sabiro et al.

(10) Patent No.: US 6,266,630 B1
(45) Date of Patent: Jul. 24, 2001

(54) METHOD AND APPARATUS FOR PROVIDING A GRAPHICAL USER INTERFACE FOR SIMULATING DESIGNS WITH ANALOG AND MIXED SIGNALS

(75) Inventors: Serge F. Garcia-Sabiro, Grenoble; Christophe P. Hui-Bon-Hoa, Meylan; Polen Kission, Grenoble; Jean-Pierre Cirigliano, Brignoud; Philippe P. Raynaud, St. Martin D'Uriage, all of (FR)

(73) Assignee: Mentor Graphics Corporation, Wilsonville, OR (US)

( * ) Notice: Subject to any disclaimer, the term of this patent is extended or adjusted under 35 U.S.C. 154(b) by 0 days.

(21) Appl. No.: 09/089,926

(22) Filed: Jun. 3, 1998

(51) Int. Cl.[7] .................................................. G06F 17/50
(52) U.S. Cl. ................................ 703/14; 703/13; 703/15
(58) Field of Search ...................... 395/500.34, 500.35, 395/500.36, 500.37; 703/13, 14, 15, 16

(56) References Cited

U.S. PATENT DOCUMENTS

| | | |
|---|---|---|
| 4,868,770 | 9/1989 | Smith et al. . |
| 4,985,860 | 1/1991 | Vlach . |
| 5,297,066 * | 3/1994 | Mayes ..................................... 703/14 |
| 5,920,484 * | 7/1999 | Nguyen et al. .......................... 703/2 |
| 5,963,724 * | 10/1999 | Mantooth et al. ...................... 703/14 |

OTHER PUBLICATIONS

Smith et al., "Mixed–Signal Circuit Simulation System with Behavioral Modeling Capability", Conference Record Southcon/94, pp. 580–583, Mar. 1994.*

Ho et al., "Wavelet Representation for Multigrid Computation in Surface Interpolation Problem", Proceedings of the 13th International Conference on Pattern Recognition, 1996, pp. 740–744, vol. 1, Aug. 1996.*

Uresin et al., "Effects of Asynchronism on the Convergent Rate of Iterative Algorithms", Journal of Parallel and Distributed Computing, vol. 34, Issue 1, pp. 66–81, Apr. 10, 1996.*

Lee et al., "Digital Filter Design Using Genetic Algorithm", IEEE Symposium on Advances in Digital Filtering and Signal Processing, 1998, pp. 34–38, Jun. 1998.*

Bertsekas et al., "Convergence Rate and Termination of Asynchoronous Iterative Algorithms", Proceedings of the Third International Conference on Supercomputing, pp. 461–470, Jun. 1989.*

Wang et al., "Design and Test of Mixed–Signal VLSI", Canadian Conference on Electrical and Computer Engineering, pp. 461–464, vol. 1, Sep. 1993.*

Gielen et al., "Analog Behavioral Models for Simulation and Sysnthesis of Mixed–Signal Systems", Proceedings of the Third European Conference on Design Automation, pp. 464–468, Mar. 1992.*

Yost et al., "Content–Based Visualization for Intelligent Problem–Solving Environments", Internations Journal of Human–Computer Studies, vol. 46, Issue4, pp. 409–441, Apr. 1997.*

* cited by examiner

Primary Examiner—Kevin J. Teska
Assistant Examiner—Douglas W. Sergent
(74) Attorney, Agent, or Firm—Blakely, Sokoloff, Taylor & Zafman LLP

(57) ABSTRACT

A method and apparatus for providing a graphical user interface for simulating designs with mixed signals is described. The present invention provides graphical information to a circuit designer as to the solution of the equation(s) that describe or model the design. The graphical information allows the designer to see convergence and convergence rates of the analog circuit simulation. By providing the designer with information related to the convergence of solutions for the modeling equations, the designer is better able to debug the design because he or she can view the timing and situations related to convergence and divergence.

10 Claims, 4 Drawing Sheets

METHOD AND APPARATUS FOR PROVIDING A GRAPHICAL USER INTERFACE FOR SIMULATING DESIGNS WITH ANALOG AND MIXED SIGNALS

FIELD OF THE INVENTION

The present invention relates to simulation of circuit designs; and more specifically, the present invention relates to a graphical representation of simulation of designs having analog and mixed signals.

BACKGROUND OF THE INVENTION

As the scale of complexity provided by integrated circuits (ICs) and related systems increases, the number of functional units included on a single die may be increased because each circuit consumes comparatively less space than before. One result of this trend is that ICs, such as processors, that have traditionally been completely digital are increasingly including analog components, such as analog-to-digital (A/D) converters, digital-to-analog (D/A) converters and phased locked loop (PLL) circuits. These ICs having both analog and digital components are known as mixed signal, or analog mixed-signal (AMS) ICs.

Because processors and other complex circuits are expensive to fabricate, designs are typically thoroughly simulated with software simulation languages such as HDL (Hardware Description Language) and VHDL (VHSIC Hardware Description Language, where VHSIC denotes "Very High Speed Integrated Circuit"). VHDL is described in greater detail in "IEEE Standard VHDL Language Reference Manual," ANSI Std. 1076–1993, Published Jun. 6, 1994. These simulation programs provide simulation and debugging for digital components. However, they do not provide simulation of analog or mixed-signal components. For this reason, designers were required to simulate analog components with simulation software such as SPICE that provide analog circuit simulation. Analog simulation, however, typically requires a much lower level of programming than digital simulation.

In order to expedite simulation of mixed-signal designs, mixed-signal extensions to HDL (HDL-A™), VHDL (VHDL-AMS), and Verilog-A (Verilog-AMS) have been designed. VHDL-AMS is described in greater detail in 1076.1 Language Design Committee, several papers under the generic name "White Papers", IEEE 1076.1 Internal work, 1996 and "1076.1 Working Document: Definition of Analog Extensions to IEEE Standard VHDL", IEEE 1076.1 Committee Internal work, Jul., 1997. These extensions provide circuit designers with a single software tool to simulate mixed signal designs. Because these unified simulation programs are extensions to previous digital simulation programs, the digital portion of the programs are largely unchanged.

The analog simulation provided by mixed-signal simulation programs typically model the analog systems using differential and algebraic equations (DAEs), including Kirchoffs Current Law (KCL) and Kirchoffs Voltage Law (KVL), which describe the interconnection of circuit elements. Because the mathematical model of analog circuits include a large number of non-linear differential equations, simulations are time consuming, even with high-speed computer systems. Simplifications, such as One Step Relaxation (OSR), Newton-Raphson Method (NRM) and Integral Equation Method (IEM) have been used. However, each requires solving sets of equations until convergence.

During simulation, the designer must wait until convergence or until a predetermined time period has elapsed to determine whether the DAEs describing the circuit converge. A need exists therefore, to provide the designer with graphical feedback during the solution of the DAEs or other equations so that he or she may monitor whether convergence occurs and at what rate convergence occurs.

SUMMARY OF THE INVENTION

A method and apparatus for providing a graphical user interface for simulating designs with mixed signals is described. A graphical representation of one or more test values corresponding to simulated conditions is generated. The test values are determined by an iterative simulation process. An indication is provided by the graphical representation for each iteration of the iterative simulation process. The graphical representation is displayed by a display device.

BRIEF DESCRIPTION OF THE DRAWINGS

The present invention is illustrated by way of example, and not by way of limitation, in the figures of the accompanying drawings in which like reference numerals refer to similar elements.

DETAILED DESCRIPTION

A method and apparatus for providing a graphical user interface for simulating designs with mixed signals is described. In the following description, for the purposes of explanation, numerous specific details are set forth in order to provide a thorough understanding of the present invention. It will be apparent, however, to one skilled in the art that the present invention may be practiced without these specific details. In other instances, well-known structures and devices are shown in block diagram form in order to avoid obscuring the present invention.

Briefly, the present invention provides graphical information to a designer as to the solution of the equation(s) that describe or model a mixed-signal designs. The graphical information allows the designer to see convergence and convergence rates of the analog simulation. By providing the designer with information related to the convergence of solutions for the modeling equations, the designer is better able to debug the design because he or she is provided with information related to the timing and situations related to convergence and divergence.

Figure 1:
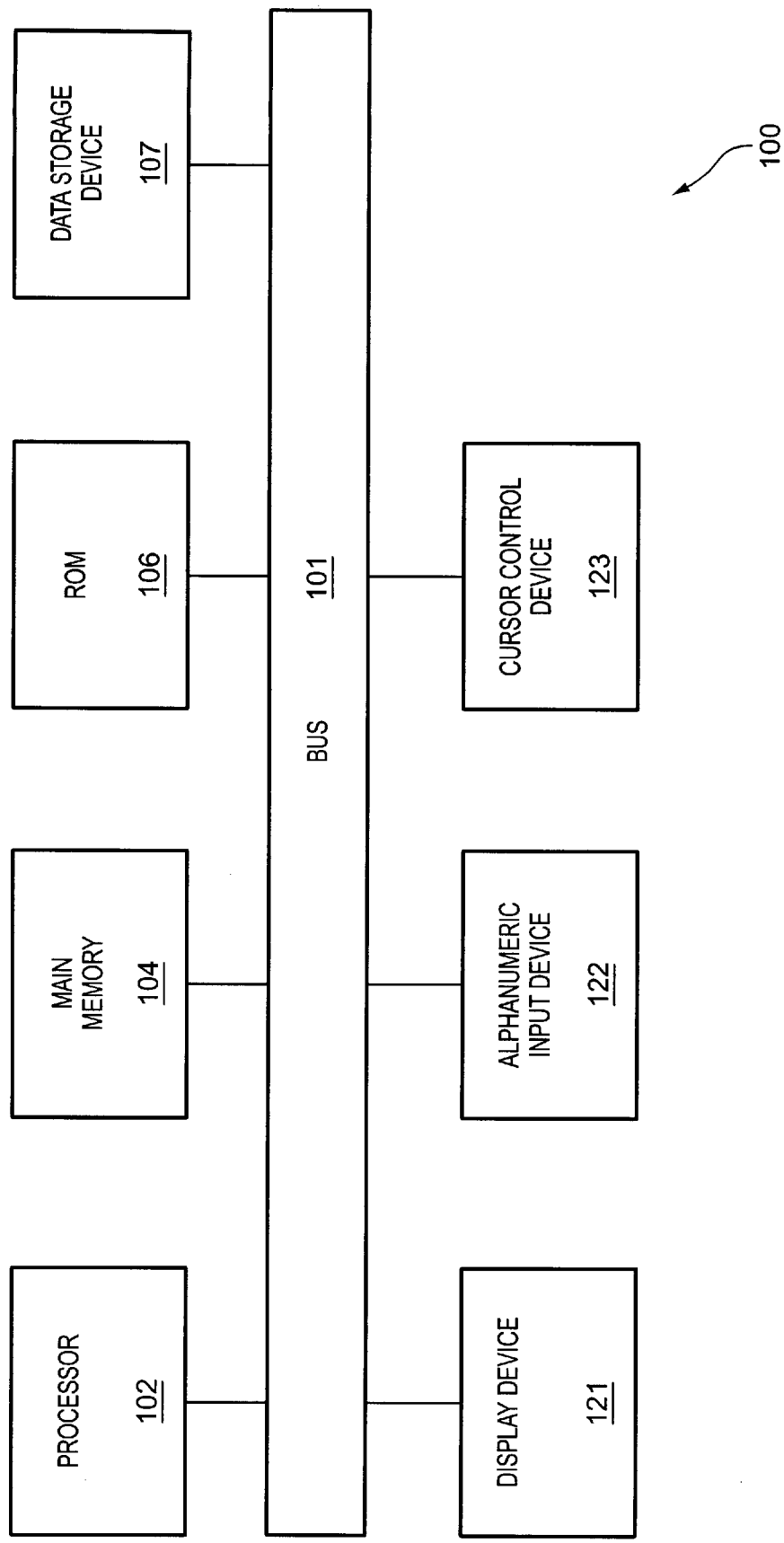
FIG. 1 is one embodiment of a computer system.

FIG. 1 is one embodiment of a computer system upon which the present invention may be implemented. Computer system 100 comprises bus 101 or other communication device for communicating information, and processor 102 coupled to bus 101 for processing information. Computer system 100 further comprises random access memory (RAM) or other dynamic storage device 104 (referred to as main memory), coupled to bus 101 for storing information and instructions to be executed by processor 102. Main memory 104 also may be used for storing temporary variables or other intermediate information during execution of instructions by processor 102. Computer system 100 also comprises read only memory (ROM) and/or other static storage device 106 coupled to bus 101 for storing static information and instructions for processor 102. Data storage device 107 is coupled to bus 101 for storing information and instructions. Data storage device 107 such as a magnetic disk or optical disc and its corresponding drive can be coupled to computer system 100.

Computer system 100 can also be coupled via bus 101 to display device 121, such as a cathode ray tube (CRT) or liquid crystal display (LCD), for displaying information to a computer user. Alphanumeric input device 122, including alphanumeric and other keys, is typically coupled to bus 101 for communicating information and command selections to processor 102. Another type of user input device is cursor control device 123, such as a mouse, a trackball, or cursor direction keys for communicating direction information and command selections to processor 102 and for controlling cursor movement on display 121.

Figure 2:
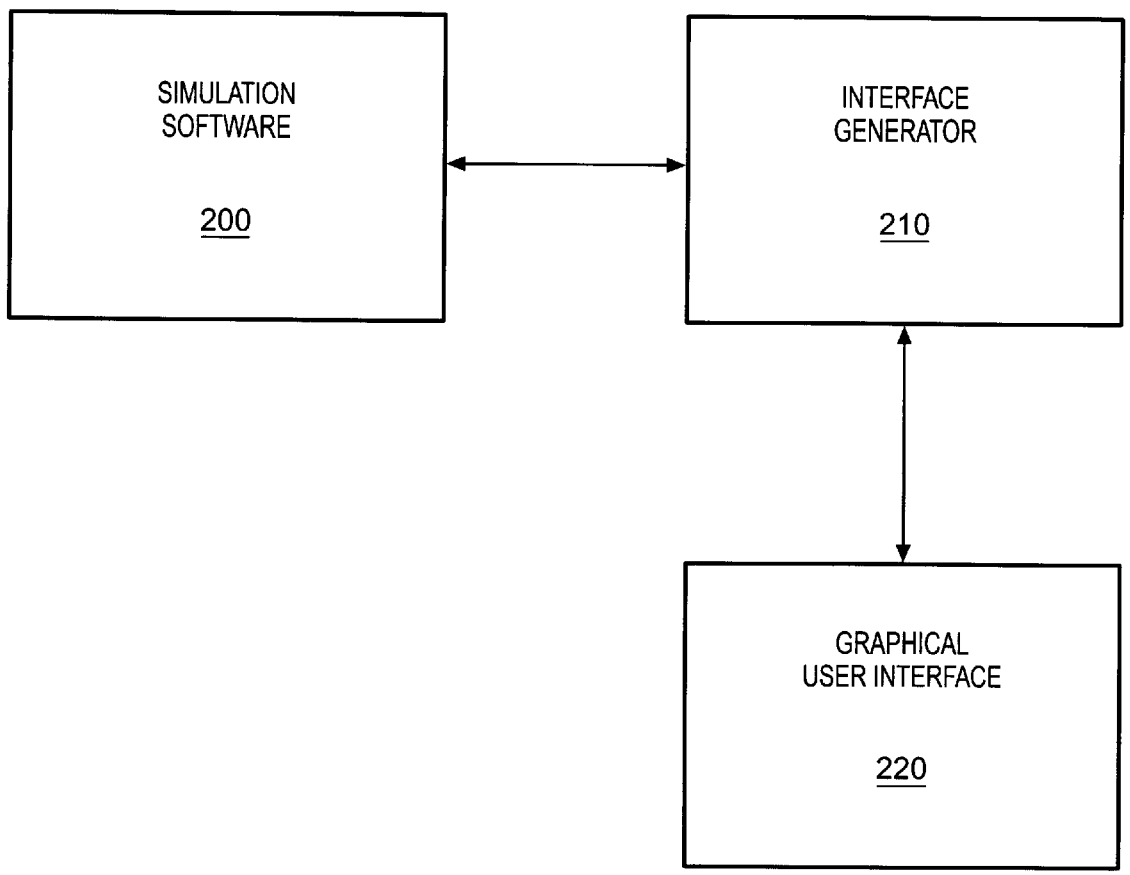
FIG. 2 is one embodiment of a block diagram of an apparatus for providing a graphical user interface for simulation of mixed-signal designs.

FIG. 2 is one embodiment of a block diagram of an apparatus for providing a graphical user interface for simulation of mixed-signal designs. Generally simulation software 200 intercommunicates with interface generator 210, which generates graphical user interface 220 in response to data provided by simulation software 200.

The components of FIG. 2 may be implemented by a computer system, such as the computer system of FIG. 1, or any other type of computer system. Furthermore, the various components of FIG. 2 may be implemented by different computer systems that are interconnected by a network, such as a local area network (LAN), the Internet, or any other type of network.

Simulation software 200 may be any simulation of hardware and/or software that simulates analog and mixed-signal circuit designs. In one embodiment, simulation software 200 is VHDL-AMS; however, other simulation programs, such as HDL-A equation solvers, netlist simulators spice simulators, etc., or other similar programs may also be used. Of course simulation software requires some hardware to run, therefore, the hardware used to execute simulation software (not shown in FIG. 2) is also part of the simulation apparatus.

Interface generator 210 communicates with simulation software 200 to receive intermediate values used during the simulation process. Interface generator 210 compiles these intermediate values to generate a graphical representation of the intermediate values and their relationship to each other.

Graphical user interface 220 displays the graphical representation of values compiled by interface generator 210. Graphical user interface 220 is displayed to a circuit designer or other user of the simulation system on a display device such as a CRT or LCD. Graphical user interface 220 may display information in addition to the intermediate values compiled by interface generator 210. For example, graphical user interface 220 may display information related to digital circuit simulation, to the digital components of a mixed signal circuit simulation, or other information.

Figure 3A:
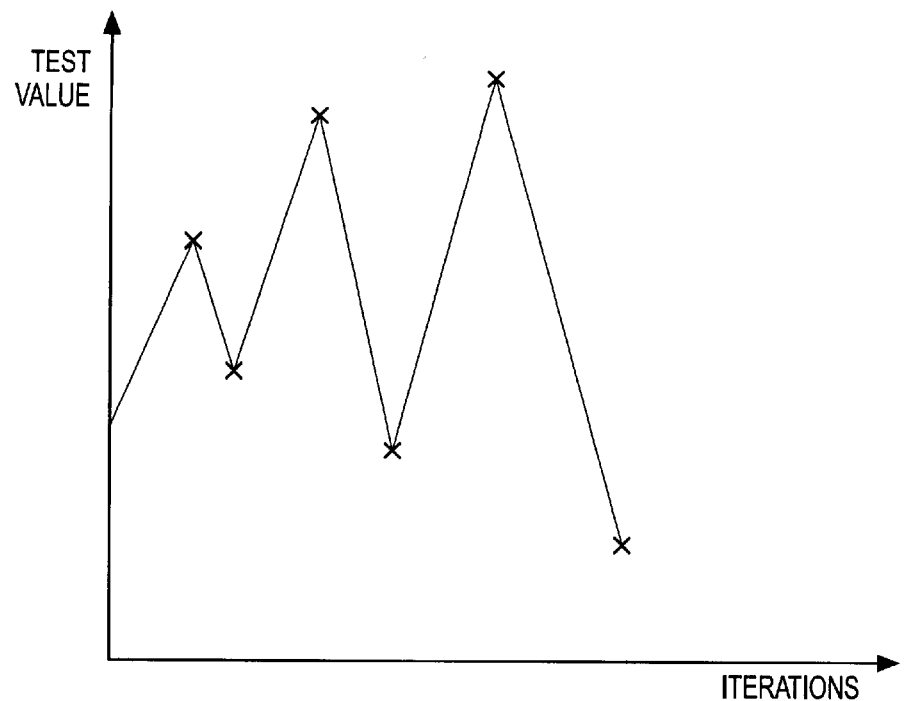
FIG. 3a is one embodiment a graphical user interface for providing feedback for simulation of a mixed-signal design that does not converge.

FIG. 3a is one embodiment a graphical user interface for providing feedback for simulation of a mixed-signal design that does not converge. The graph of FIG. 3a is described in terms of test values on the vertical axis and iterations on the horizontal axis. The vertical axis is labeled test value for purposes of explanation and may be replaced with specific variables (e.g., voltage, current) for simulation.

In one embodiment, for each iteration of the evaluation process, the graphical user interface generator determines coordinates on a graph displayed (or graph to be displayed) corresponding to the result of the evaluation. An indicator is generated for each iteration of the evaluation process. In one embodiment, the indicator is an "x" character; however, any indicator, such as a dot, a box, a number, a character, etc. could be used. In addition, indicators may be color coded, for example, red for voltages.

By providing graphical feedback to the designer, the conditions that result in an unstable, divergent design may be isolated more readily than simply determining whether the DAEs describing the circuit design or not. Because the circuit designer may be aware of the conditions that make the circuit design unstable, the designer is better able to modify the circuit design appropriately to achieve the desired circuit performance.

Figure 3B:
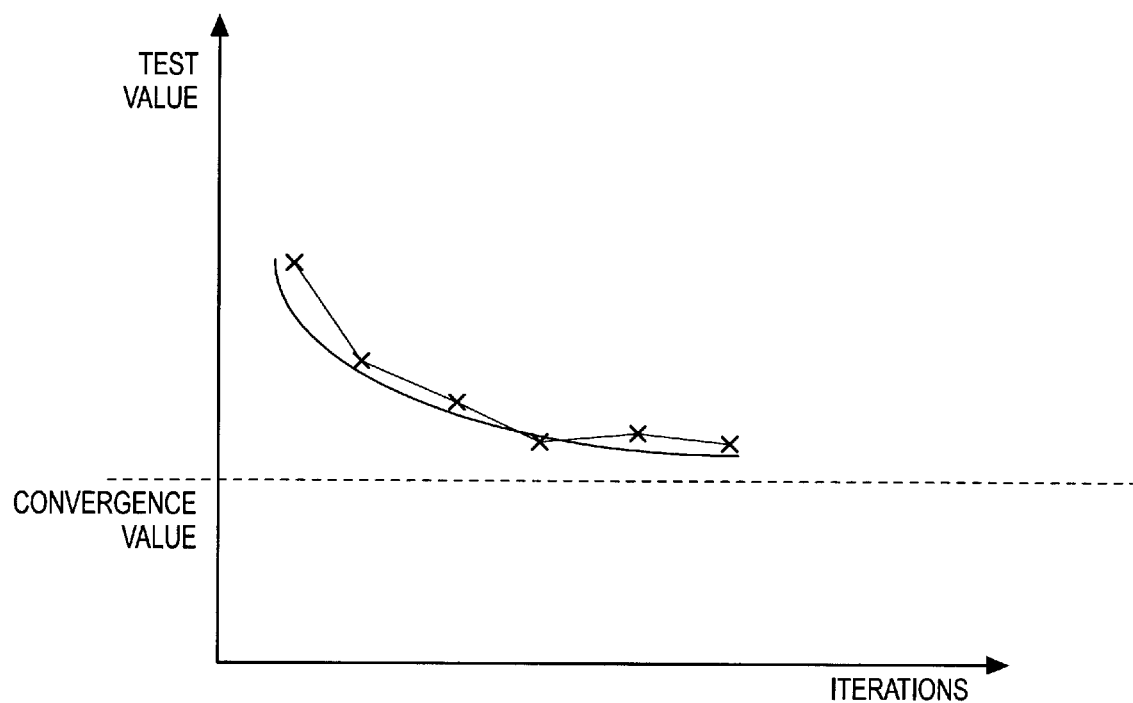
FIG. 3b is one embodiment of a graphical user interface for providing feedback for simulation of a mixed-signal design that does converge.

FIG. 3b is one embodiment of a graphical user interface for providing feedback for simulation of a mixed-signal design that does converge. The graph of FIG. 3b is described in terms of test values and iterations for the same reasons as FIG. 3a above.

The graph of FIG. 3b is generated in the same manner as the graph of FIG. 3a ; however, the output values represented converge to a particular value. In one embodiment, a line is provided to indicate the value to which the simulation values are converging. However, this convergence line is not required to provide a useful graphical user interface. As with the graph of FIG. 3a, values may be represented with a variety of indicators. The graphical user interface may also provide an indication (e.g., a line or printed value) of the value to which the DAE solutions converge.

Figure 4:
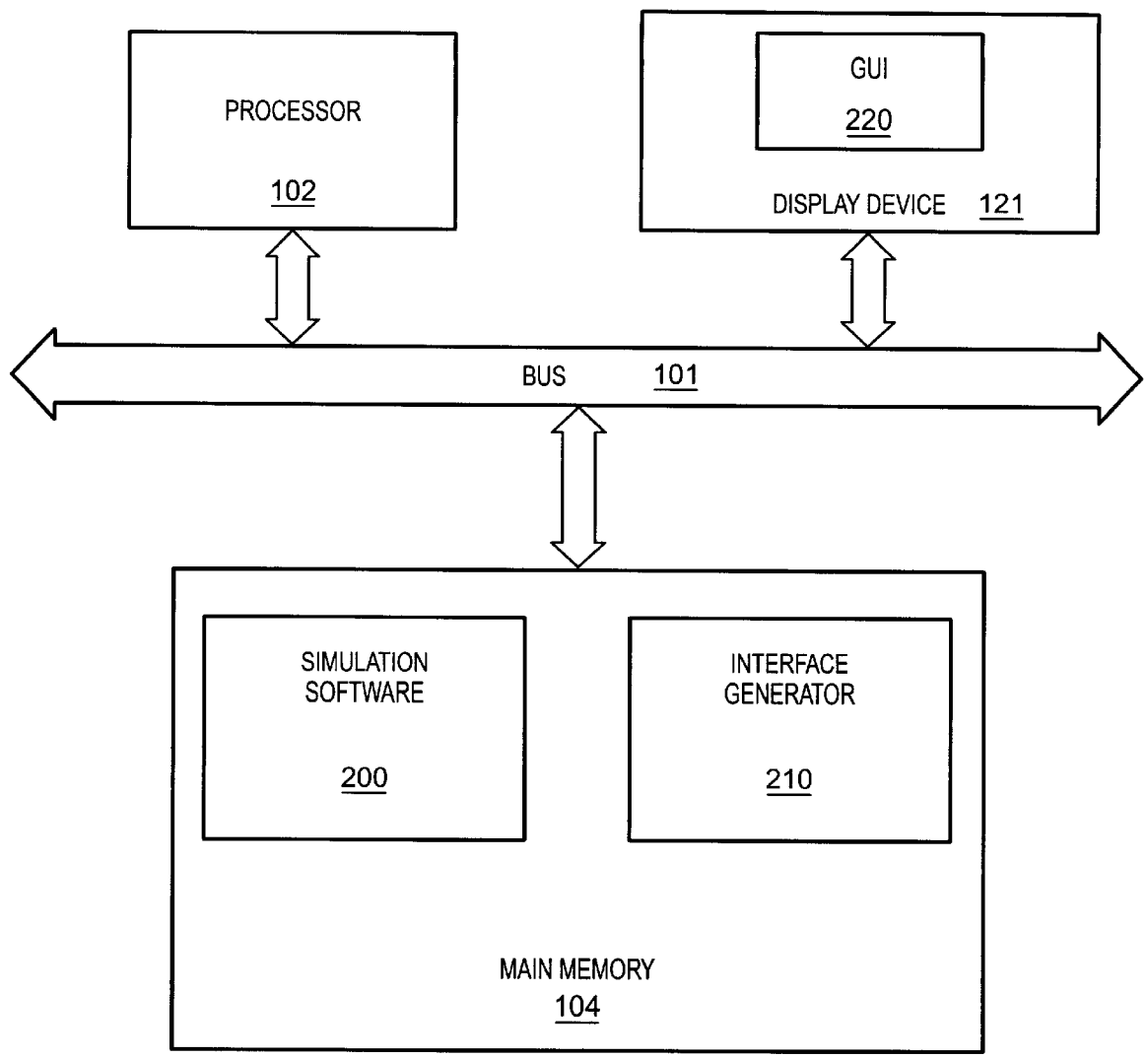
FIG. 4 is one embodiment of a computer system performing analog/mixed-signal simulation and providing graphical feedback based on iterative results of the simulation.

FIG. 4 is one embodiment of a computer system performing analog/mixed-signal simulation and providing graphical feedback based on iterative results of the simulation. Processor 102 executes program instructions (not shown in FIG. 4) to perform functions of simulation software 200 stored in main memory. Program instructions are communicated to processor 102 via bus 101.

Interface generator 210 is also stored in main memory 104. Interface generator 210 includes sequences of instructions (not shown in FIG. 4) that cause processor 102 to compile intermediate data from simulation to provide feedback to a user of the simulation system.

The data compiled is displayed on display device 121 in the form of graphical user interface (GUI) 220. Data is communicated between main memory 104, processor 102 and display device 121 via bus 101 to provide graphical user interface 220. Of course, additional information may be displayed by display device 121. In this manner, the present invention provides intermediate data to a circuit designer in the form of a graphical user interface.

In the foregoing specification, the invention has been described with reference to specific embodiments thereof. It will, however, be evident that various modifications and changes may be made thereto without departing from the broader spirit and scope of the invention. The specification and drawings are, accordingly, to be regarded in an illustrative rather than a restrictive sense.

What is claimed is:

1. A method comprising:
   generating a graphical representation of one or more test values corresponding to simulated circuit conditions, wherein the test values are determined by an iterative simulation process, and further wherein an indication is provided by the graphical representation for completed iterations prior to completion of the iterative simulation process; and providing graphical feedback during the iterative simulation process regarding a convergence trend toward a convergence value by:
displaying the graphical representation,
determining the convergence value to which the test values converge, if any, and
displaying a convergence indication as part of the graphical representation.

2. The method of claim 1 further comprising:
generating a convergence line that indicates the convergence trend, if any; and
displaying the convergence line.

3. A method comprising:
modeling a mixed-signal design with one or more differential and algebraic equations (DAEs);
performing iterative approximations of a solution to a set of equations including the DAEs for modeling the mixed-signal design;
displaying an indication for the iterative approximations for completed iterations prior to completion of the iterative approximations;
determining a convergence value to which the approximations converge, if any; and
displaying the convergence value as part of the graphical representation.

4. A The method of claim 3 further comprising:
generating a convergence line that indicates a convergence trend towards the convergence value, if any; and
displaying the convergence line.

5. A computer-readable medium having stored thereon sequences of instructions which, when executed, cause one or more electronic systems to:
generate a graphical representation of one or more test values corresponding to simulated circuit conditions, wherein the test values are determined by an iterative simulation process, and further wherein an indication is provided by the graphical representation for completed iterations prior to completion of the iterative simulation process;
display the graphical representation;
determine a convergence value to which the test values converge, if any; and
display the convergence value as part of the graphical representation.

6. The computer-readable medium of claim 5 further comprising sequences of instructions that, when executed, cause the one or more electronic systems to:
generate a convergence line that indicates a convergence trend towards the convergence value, if any; and
display the convergence line.

7. An apparatus comprising:
a mixed-signal simulator to perform simulation of a mixed-signal circuit design by performing iterative mathematical evaluation of the mixed-signal circuit design;
a graphical user interface generator coupled to receive one or more test values from the mixed-signal simulator, wherein the test values correspond to one or more signal levels in the mixed-signal circuit design under simulated circuit conditions, the graphical user interface generator to generate a graphical representation of the test values having a test value indicator for completed iterations prior to completion of the evaluation process, wherein the graphical representation includes an indication of a convergence trend for the test values, if the test values converge; and
a display device coupled to receive the graphical representation from the graphical user interface, the display device to display the graphical representation.

8. The apparatus of claim 7, wherein the graphical representation further includes a convergence line that indicates a general trend from an initial value of the test values to a convergence value for the test values, if the test values converge.

9. An apparatus comprising:
means for generating a graphical representation of one or more test values corresponding to simulated circuit conditions, wherein the test values are determined by an iterative simulation process, and further wherein an indication is provided by the graphical representation for completed iterations prior to completion of the iterative simulation process; and
means for providing graphical feedback during the iterative simulation process regarding a convergence trend toward a convergence value by:
displaying the graphical representation,
determining the convergence value to which the test values converge, if the test values converge, and
displaying a convergence indication as part of the graphical representation.

10. The apparatus of claim 9 further comprising:
means for generating a convergence line that indicates the convergence trend, if the test values converge; and
means for displaying the convergence line.

* * * * *

UNITED STATES PATENT AND TRADEMARK OFFICE
CERTIFICATE OF CORRECTION

PATENT NO.   : 6,266,630 B1
DATED        : July 24, 2001
INVENTOR(S)  : Garcia-Sabiro et al.

It is certified that error appears in the above-identified patent and that said Letters Patent is hereby corrected as shown below:

<u>Title page,</u>
References Cited, OTHER PUBLICATIONS, Bertsekas et al, delete "Asynchoronous" and insert -- Asynchronous --
Gielen et al, delete "Sysnthesis" and insert -- Synthesis --
Yost et al, delete "Internations" and insert -- International -- and delete "Issue4," and insert -- Issue 4, --

<u>Column 3,</u>
Line 41, delete "simulators,etc.," and insert -- simulators, etc., --

<u>Column 4,</u>
Line 23, delete "3$a$ ;" and insert -- 3$a$; --

<u>Claim 4,</u>
First line, delete "A"

Signed and Sealed this

Nineteenth Day of March, 2002

Attest:

JAMES E. ROGAN
*Attesting Officer*     *Director of the United States Patent and Trademark Office*